United States Patent
Lombardi et al.

(10) Patent No.: US 6,451,159 B1
(45) Date of Patent: Sep. 17, 2002

(54) GROUNDED CENTERING RING FOR INHIBITING POLYMER BUILD-UP ON THE DIAPHRAGM OF A MANOMETER

(75) Inventors: Joe A. Lombardi, Boise; Roger Schutz, Star, both of ID (US)

(73) Assignee: Lam Research Corporation, Fremont, CA (US)

( * ) Notice: Subject to any disclaimer, the term of this patent is extended or adjusted under 35 U.S.C. 154(b) by 28 days.

(21) Appl. No.: 09/666,688

(22) Filed: Sep. 20, 2000

(51) Int. Cl.[7] .............................. C23F 1/02; C23C 16/00
(52) U.S. Cl. .............................. 156/345.26; 118/723 R; 118/712; 156/345.24; 204/298.03; 204/298.32
(58) Field of Search ......................... 118/723 R, 723 E, 118/723 ER, 723 I, 723 IR, 723 AN, 723 MW, 723 ME, 723 MA, 723 MR, 712, 715, 692; 156/345.29, 345.24, 345.26, 345.41, 345.47, 345.48; 204/298.03, 298.32

(56) References Cited

U.S. PATENT DOCUMENTS

| | | | | |
|---|---|---|---|---|
| 5,871,813 A | * | 2/1999 | Pham | 118/715 |
| 5,948,169 A | * | 9/1999 | Wu | 118/715 |
| 6,132,513 A | * | 10/2000 | Kadkhodayan et al. | 118/715 |

* cited by examiner

Primary Examiner—Gregory Mills
Assistant Examiner—Luz Alejandro
(74) Attorney, Agent, or Firm—Beyer Weaver & Thomas, LLP

(57) ABSTRACT

A grid protects a manometer diaphragm from plasma. A plasma chamber is used to generate a plasma. A manometer is used to measure the pressure in the plasma chamber. A grounded electrically conductive grid is used to screen out ions in the plasma before they reach a diaphragm in the manometer. The grid may be formed in a centering ring. A pipe may be used to connect the manometer to the plasma chamber. The centering ring may be placed in the joint in the pipe, with the centering ring and grid being grounded to the pipe.

10 Claims, 5 Drawing Sheets

GROUNDED CENTERING RING FOR INHIBITING POLYMER BUILD-UP ON THE DIAPHRAGM OF A MANOMETER

BACKGROUND OF THE INVENTION

The present invention relates to the vacuum chambers used for manufacturing. More particularly, the present invention relates to plasma vacuum chambers used for manufacturing.

In the fabrication of semiconductor-based devices (e.g., integrated circuits, or flat panel displays) layers of material may alternately be deposited onto and etched from a substrate surface (e.g., the semiconductor wafer or the glass panel) in a vacuum chamber. To help maintain a constant pressure in the vacuum chamber, a manometer with an elastic diaphragm may be used. Processes in the vacuum chamber may create substances, which may coat the elastic diaphragm, which may change the elastic properties of the diaphragm. A change in the elastic properties of the diaphragm may affect the readings of the manometer.

To facilitate discussion, FIG. 1 is a schematic view of plasma processing chamber 100, which may be used in the prior art. The plasma processing chamber 100 which may be a vacuum chamber that contains a chuck 104, representing the workpiece holder on which a substrate 106 is positioned, plasma generation equipment, which may be an upper electrode 124 and an RF source 126, a gas source 120, and an exhaust port 128. Chuck 104 may be implemented by any suitable chucking technique, e.g., electrostatic, mechanical clamping, vacuum, or the like. A manometer 140 is in fluid connection with the plasma processing chamber 100 through a manometer pipe 142. The manometer pipe 142 allows the pressure in the plasma processing chamber 100 to reach a diaphragm 144 in the manometer 140, so that a change in shape of the manometer diaphragm 144 may be used to measure pressure in the plasma processing chamber 100. A manometer pipe joint 148 allows for a detachable connection between the manometer 140 and the plasma processing chamber 100.

FIG. 2 is an enlarged exploded view of the manometer pipe joint 148, such as a KF fitting used it the prior art. The manometer pipe joint 148, comprises a first pipe end 150, a second pipe e end 152, a centering ring 154, an O-ring 156, a first weld flange 158, a second weld flange 160, and a hinged clamp 170 (only the cross-sectional parts of the hinged clamp is shown for clarity). The first weld flange 158 is welded to the first pipe end 150, as shown. Likewise, the second weld flange 160 is welded to the second pipe end 152. The O-ring 156 is placed to fit around the centering ring 154. The centering ring 154 fits between and within the first weld flange 158 and the second weld flange 160. The centering ring 154 holds the O-ring 156 between a first flange 164 surrounding the first weld flange 158 on the first pipe end 150 and a second flange 166 surrounding the second weld flange 160 on the second pipe end 152. The O-ring 156 is compressed between the first flange 164 and the second flange 166. The hinged clamp 170 presses the first flange 164 and the second flange 166 together so that they compress the O-ring 156. FIG. 3 is a side view of the centering ring 154 within the O-ring 156. A large aperture 304 in the centering of the centering ring 154 allows plasma to pass from the first pipe end 150 to the second pipe end 152.

It is desirable to reduce the coating of substances on the diaphragm.

SUMMARY OF THE INVENTION

To achieve the foregoing and other objects and in accordance with the purpose of the present invention, a plasma processing device with a manometer with a diaphragm is provided. The plasma processing device has a plasma processing chamber with a passageway, which provides a fluid connection between the plasma processing chamber and the diaphragm. An electrically conductive grid is placed across the cross-section of the passageway.

In addition a method for measuring pressure in a plasma device is provided: Generally, a plasma chamber is provided. A manometer is also provided. A passageway in fluid connection between the plasma chamber and the manometer is also provided. An electrically conductive grid is placed across the passage way.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures o f the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
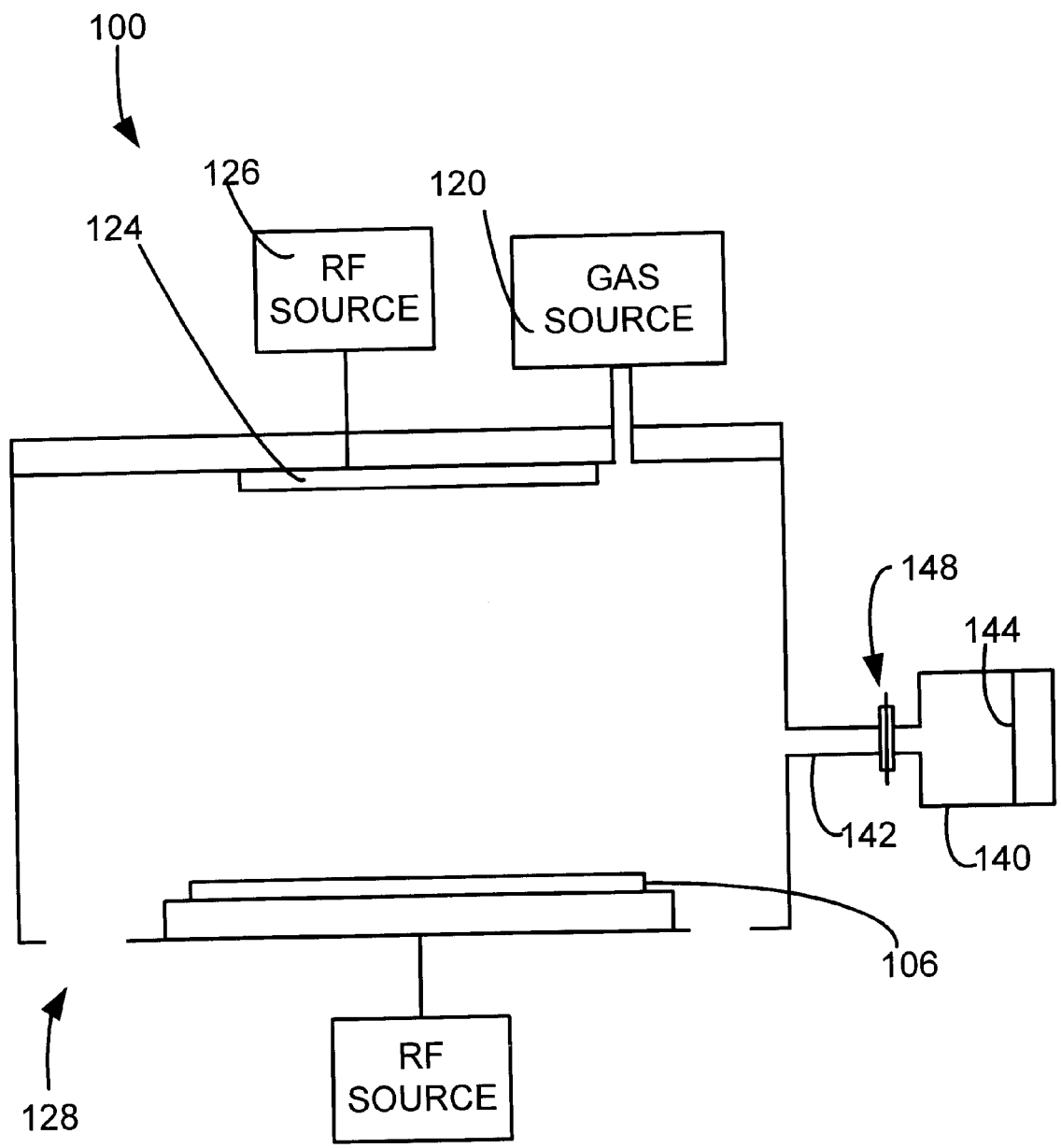
FIG. 1 is a schematic view of a prior art plasma processing chamber.
Figure 2:
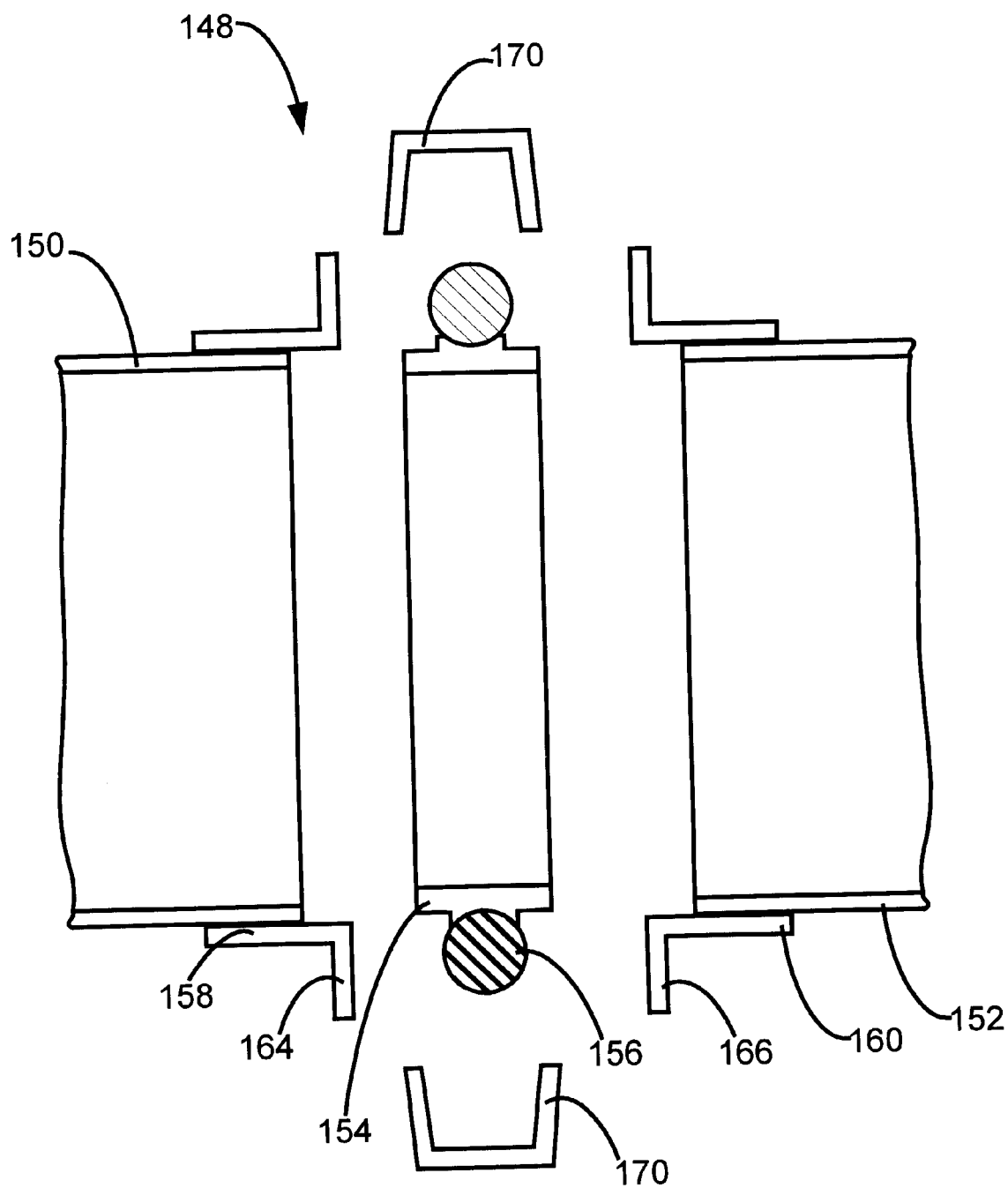
FIG. 2 s an enlarged exploded view of the manometer pipe joint such as a KF fitting used in the prior art.
Figure 3:
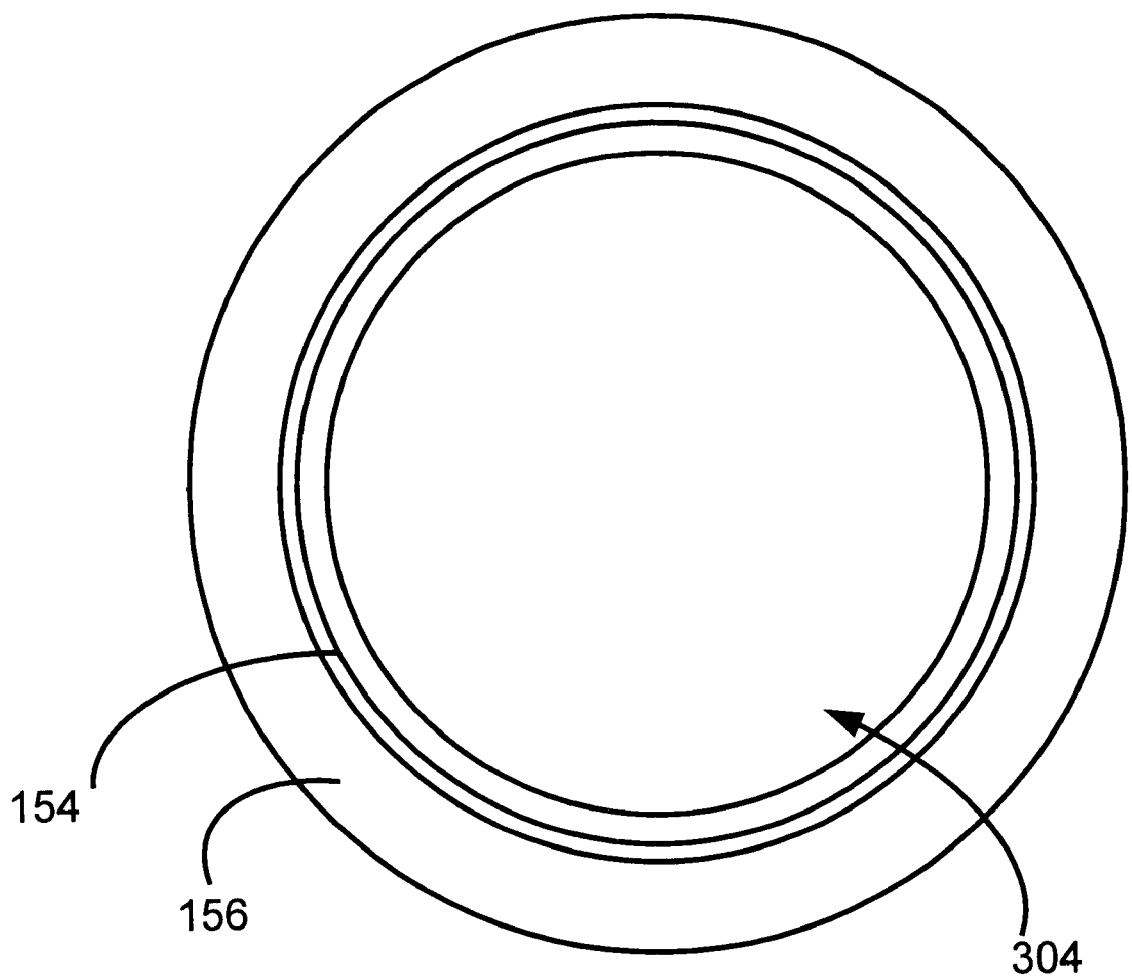
FIG. 3 is a side view of a centering ring within an O-ring used in the prior art.

The invention provides a grounded screen to reduce plasma reaching the diaphragm of a manometer in a plasma device. To facilitate discussion, FIG. 4 is an enlarged exploded view of the manometer pipe joint 448, such as a KF fitting used in a plasma processing chamber, such as the plasma processing chamber illustrated in FIG. 1.

Similar parts share the same reference number. The manometer pipe joint 448, comprises a first pipe end 150, a second pipe end 152, an electrically conductive centering ring 404, an O-ring 156, a first weld flange 158, a second weld flange 160, and a hinged clamp 170 (only the cross-sectional parts of the hinged clamp is shown for clarity). The first weld flange 158 is welded to the first pipe end 150, as shown. Likewise, the second weld flange 160 is welded to the second pipe end 152. The O-ring 156 is placed to fit around the centering ring 404. The centering ring 404 fits between and within the first weld flange 158 and the second weld flange 160. The centering ring 404 holds the O-ring 156 between a first flange 164 surrounding the first weld flange 158 on the first pipe end 150 and a second flange 166 surrounding the second weld flange 160 on the second pipe end 152. The O-ring 156 is compressed between the first flange 164 and the second flange 166. The hinged clamp 170 presses the first flange 164 and the second flange 166 together so that they compress the O-ring 156.

Figure 4:
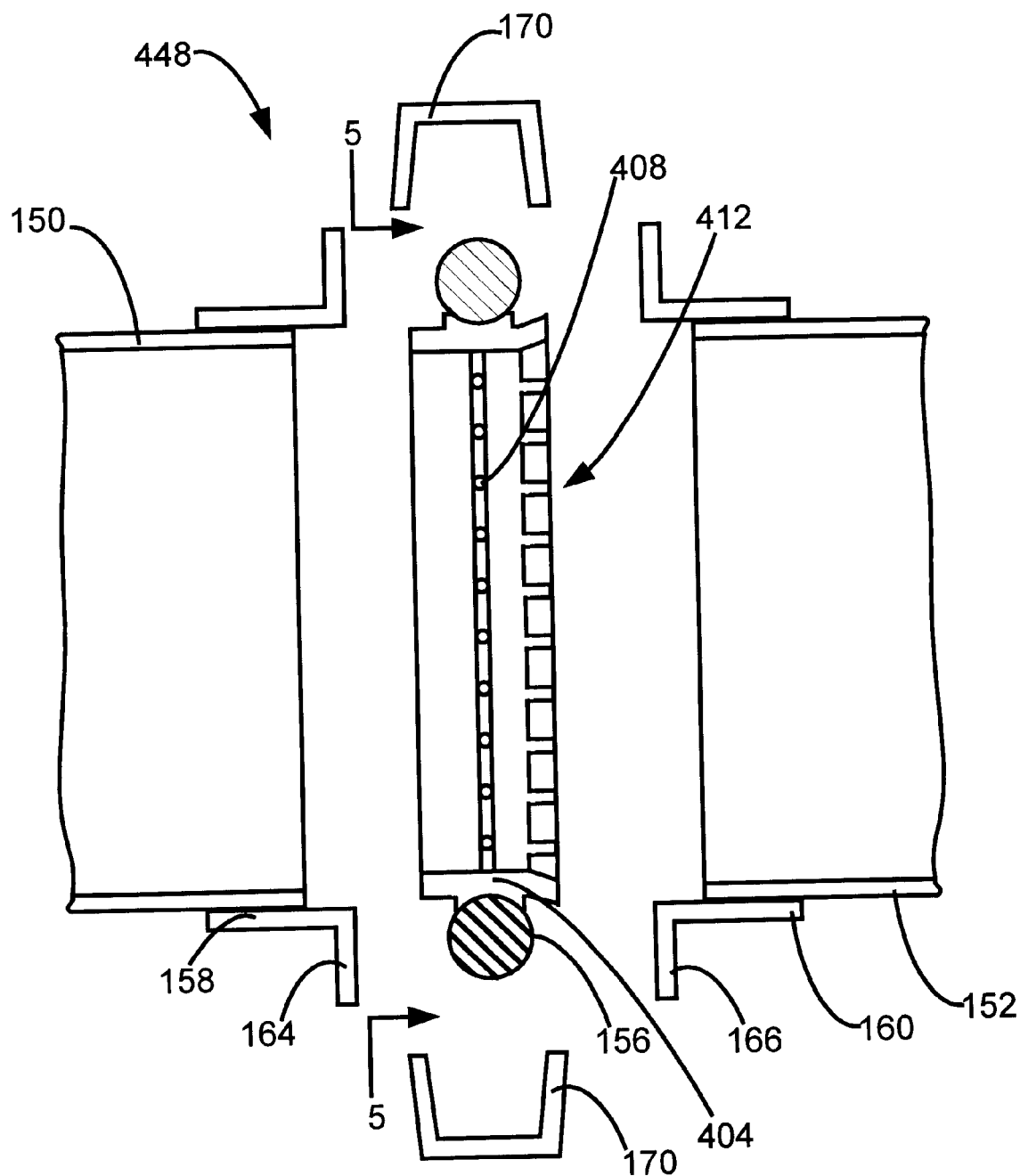
FIG. 4 is an enlarged exploded view of the manometer pipe joint, such as a KF fitting used in a plasma processing chamber according to an embodiment of the invention.
Figure 5:
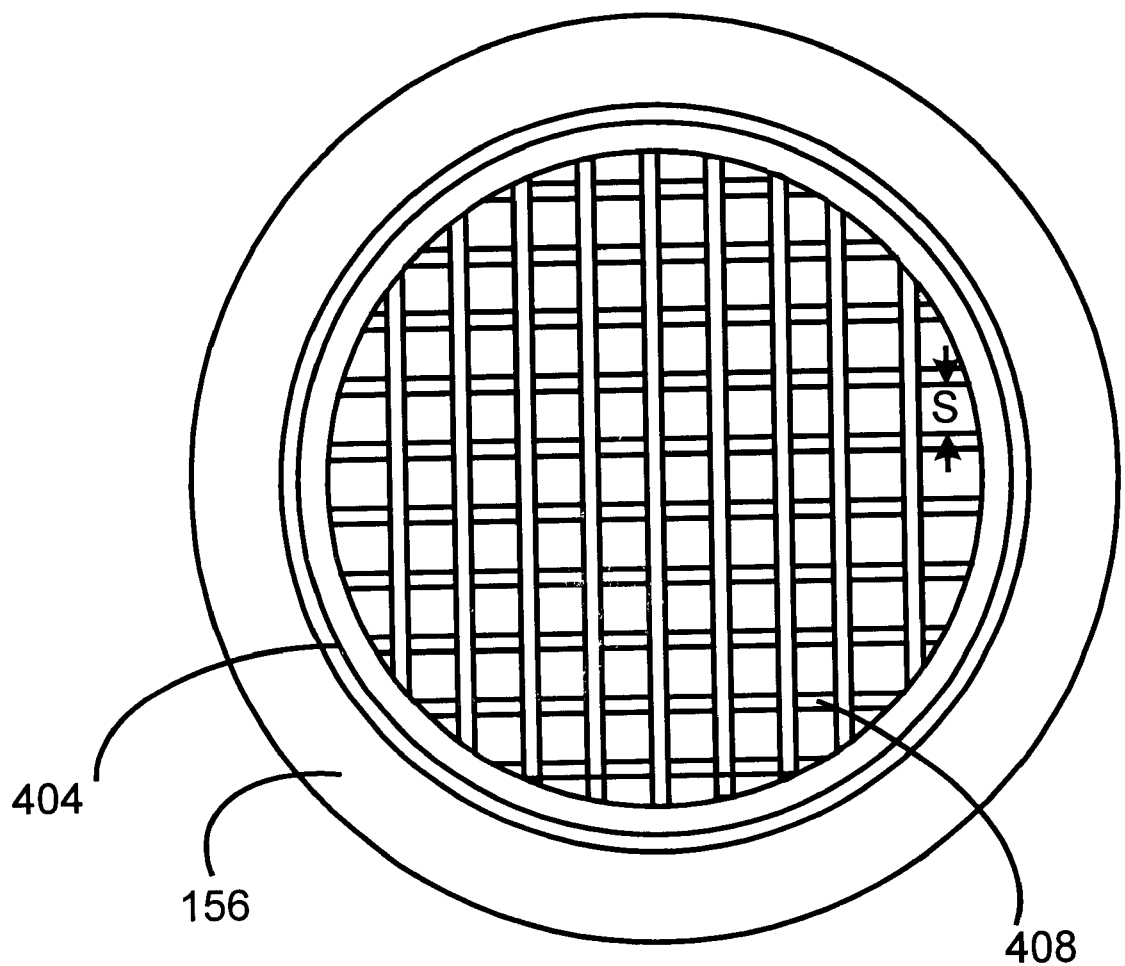
FIG. 5 is a side view of the centering ring according to the embodiment of the invention.

FIG. 5 is a side view of the centering ring 404 is indicated by view line 5—5 in FIG. 4. The centering ring 404 has a grid 408 in the aperture through the centering ring 404. The grid 408 is made of an electrically conducting material, which is preferably stainless steel wire. A grounding braid 412, is placed on at least one end of the centering ring 404 to provide a grounding connection between the centering ring 404 and a pipe end or a weld flange. The grounding braid 412 slightly flares an end of the centering ring 404. Other grounding devices may be used to ground the centering ring 404 and grid 408. If grounding braids are used on both sides of the centering ring, then the centering ring may be grounded to both pipe ends. The spacing S between grid wires is preferably between 1 and 1/64 inch. More preferably the spacing S between the grid wires is between 1/32 to 1/2. Most preferably, the spacing S between grid wires is between 1/16 to 1/4 inch.

In operation, the grounding braid 412 causes the electrically conductive centering ring 404 to be grounded. The centering ring 404 grounds the grid 408. Plasma is generated in a plasma processing chamber, such as the chamber shown in FIG. 1. Some of the plasma passes through a manometer pipe 142 towards the manometer diaphragm. As the plasma passes the grid 408, most of the ions in the plasma are collected by the grid 408. Since the grid 408 is grounded, the grid does not become charged. The diaphragm is protected. Grounding may be improved by placing the grounding braid on both sides of the centering ring.

In another embodiment of the invention, a grid may be mounted directly in part of a manometer pipe, instead of in a centering ring in a KF fitting. In another embodiment of the invention, the grid may be placed along a side of the plasma chamber to cover an entrance to a manometer pipe. In another embodiment of the invention, the grid may be placed into a Vacuum Coupled Reactive® VCR gasket. In another embodiment of the invention, the grid may be placed across the throat of the manometer. Generally, the manometer pipe and throat of the manometer form a passageway between the interior of the plasma chamber and the diaphragm of the manometer. The grounded electrically conductive grid is placed across the cross-section of the passageway. The spacing S between grid wires is preferably between 1 and 1/64 inch.

While this invention has been described in terms of several preferred embodiments, there are alterations, permutations, and substitute equivalents which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A plasma processing device with a manometer including a diaphragm, comprising:

plasma processing chamber;

a passageway, which provides a fluid connection between the plasma processing chamber and the diaphragm, wherein the passageway has a cross-section which crosses a direction of fluid flow; and an electrically conductive grid across the cross-section of the passageway.

2. The plasma processing device, as recited in claim 1, wherein the electrically conductive grid is grounded.

3. The plasma processing device, as recited in claim 2, wherein the electrically conductive grill has a spacing between 1 and 1/64 inch.

4. The plasma processing device, as recited in claim 3, wherein the passageway comprises a centering ring, wherein the electrically conductive grid spans across the centering ring.

5. The plasma processing device, as recited in claim 4, wherein the passageway further comprises a pipe.

6. The plasma processing device, as recited in claim 5, wherein the pipe has a joint in a first pipe end connected to a second pipe end.

7. The plasma processing device, as recited in claim 6, wherein the centering ring is placed between the first pipe end and the second pipe end.

8. The plasma processing device, as recited in claim 7, wherein the joint further comprises:

a first weld flange connected to the first pipe end; and a second weld flange connected to the second pipe end, wherein the centering ring is placed between the first weld flange and the second weld flange.

9. The plasma processing device, as recited in claim 8, wherein the joint further comprises an O-ring surrounding the centering ring, wherein the O-ring is placed between the first weld flange and the second weld flange.

10. The plasma processing device, as recited in claim 9, wherein the joint further comprises a clamp, which clamps the first weld flange to the second weld flange.

* * * * *